United States Patent [19]
Wakefield et al.

[11] Patent Number: 5,165,067
[45] Date of Patent: Nov. 17, 1992

[54] SEMICONDUCTOR CHIP PACKAGES

[75] Inventors: Elwyn P. M. Wakefield, Bristol; Christopher P. H. Walker, Portishead, both of United Kingdom

[73] Assignee: INMOS Limited, Bristol, United Kingdom

[21] Appl. No.: 782,863

[22] Filed: Oct. 15, 1991

Related U.S. Application Data

[63] Continuation of Ser. No. 617,997, Nov. 26, 1990, abandoned.

[30] Foreign Application Priority Data

Dec. 1, 1989 [GB] United Kingdom ............... 8927164

[51] Int. Cl.⁵ ............... H01L 23/48; H01L 23/02; H01L 23/12
[52] U.S. Cl. ............................. 257/783; 257/693
[58] Field of Search ............... 357/74, 70; 365/228; 361/396, 412

[56] References Cited

U.S. PATENT DOCUMENTS

| | | | |
|---|---|---|---|
| 4,632,293 | 12/1986 | Feinstein | 228/119 |
| 4,868,712 | 9/1989 | Woodman | 361/396 |
| 4,907,128 | 3/1990 | Solomon et al. | 361/412 |
| 4,953,060 | 8/1990 | Lauffer et al. | 361/396 |
| 4,956,694 | 9/1990 | Eide | 357/74 |
| 4,972,253 | 11/1990 | Palino et al. | 357/74 |
| 4,975,765 | 12/1990 | Ackermann et al. | 357/74 |
| 4,979,016 | 12/1990 | Lee | 357/74 |
| 5,016,138 | 5/1991 | Woodman | 361/396 |

FOREIGN PATENT DOCUMENTS

| | | |
|---|---|---|
| 63-018654 | 1/1988 | Japan . |
| 63-081973 | 4/1988 | Japan . |
| 63-204635 | 8/1988 | Japan . |
| 1-077136 | 3/1989 | Japan . |

Primary Examiner—Jerome Jackson, Jr.
Assistant Examiner—Daniel N. Russell
Attorney, Agent, or Firm—Edward D. Manzo

[57] ABSTRACT

A semiconductor chip package comprising at least one semiconductor chip disposed in a package and a plurality of first and second pins extending from the package, which first pins are electrically connected to the at least one semiconductor chip and are adapted to conduct signals between the at least one semiconductor chip and external circuitry, the first pins being divided into a plurality of groups, each group representing a respective signal type, and which second pins are not electrically connected to the at least one semiconductor chip, the first pins of at least one group and the second pins being asymmetrically disposed along edges of the package and the remaining groups of first pins being symmetrically disposed along edges of the package. The invention also provides a stacked module of the semiconductor chip package.

51 Claims, 4 Drawing Sheets

SEMICONDUCTOR CHIP PACKAGES

This is a continuation of Ser. No. 617,997 filed on Nov. 26, 1990, now abandoned.

BACKGROUND OF THE INVENTION

The present invention relates to a semiconductor chip package and to a module of semiconductor chip packages.

In the electronics industry there is a continuing need to reduce the size of electronic components. Currently, there is a trend towards the use of a third dimension i.e. the vertical dimension, both in the manufacture of silicon devices and in the way those devices are assembled on a printed circuit board.

The Applicant INMOS Limited currently manufactures Transputer (computer on a chip) modules (TRAMs), which modules are stackable by the employment of redundant pins on the modules that are not connected to any circuitry. A TRAM with active circuitry on those pins can then be plugged into the redundant pins and hence connected to a mother board.

Random Access Memories (RAMs) conventionally come in Dual Inline Packages (DIPs) with an even number of pins. If a particular device requires an odd number of pins, one of the pins is normally left redundant or not connected. If this redundant pin is adjacent to one of the signals that selects the RAM, it is possible to build two different assemblies of the RAM, one which uses the normal pin for chip select (CS), and the other of which uses the adjacent pin for chip select. When a pair of one of each of these two different RAMs is stacked together, it appears on the printed circuit board as a single device with two chip select pins. The upper device has a chip select pin which is above the redundant pin of the lower device and the lower device has a chip select pin which is below a redundant Pin of the upper device. A disadvantage of this arrangement is that two different assemblies of the RAM are required; one with a chip select pad on the silicon chip bonded to the normal chip select pin and another with the chip select pad bonded to the normally not connected (NC) pin.

EP-A-0157147 (IBM) discloses a stacked double density memory module using industry standard memory chips which is a modification of the known arrangement discribed above. On the top chip the chip select pin is bent so as not to contact the corresponding pin on the bottom chip and the upper chip select pin is connected to the no-connect pin of the upper chip by a jumper in the form of a U-shaped strap. The no-connect pin contacts the underlying no-connect pin of the bottom chip. This arrangement also suffers from the disadvantage that two different chip assemblies are required, one with a jumper and one without a jumper. Also, one of the pins on the top chip must be bent or cut to retain the jumper.

SUMMARY OF THE INVENTION

The present invention provides a semiconductor chip package comprising at least one semiconductor chip disposed in a package and a plurality of first and second pins extending from the package, which first pins are electrically connected to the at least one semiconductor chip and are adapted to conduct signals between the at least one semiconductor chip and external circuitry, the first pins being divided into a plurality of groups, each group representing a respective signal type, and which second pins are not electrically connected to the at least one semiconductor chip, the first pins of at least one group and the second pins being asymmetrically disposed along edges of the package and the remaining groups of first pins being symmetrically disposed along edges of the package.

The present invention further provides a module of semiconductor chip packages, the module comprising two of the semiconductor chip packages according to the invention which are stacked together to form a stacked pair of packages with each first pin of the said remaining groups of one package being connected to a corresponding first pin of the other package and each pin of the said at least one group of the said one package being connected to a respective second pin of the said other package.

BRIEF DESCRIPTION OF THE DRAWINGS

Embodiments of the present invention will now be described by way of example of example only with reference to the accompanying drawings in which.

DETAILED DESCRIPTION OF THE PREFERRED EMBODIMENTS

Figure 1:
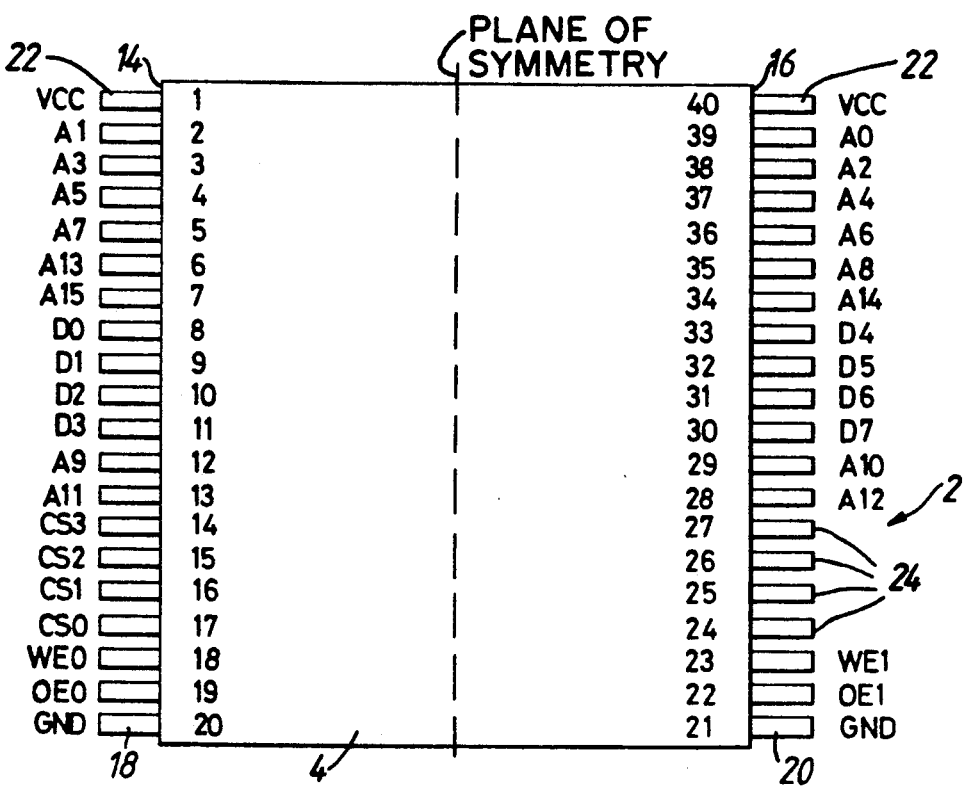
FIG. 1 is a schematic plan view of the pinout arrangement of a semiconductor chip package in accordance with a first embodiment of the present invention.
Figure 2:
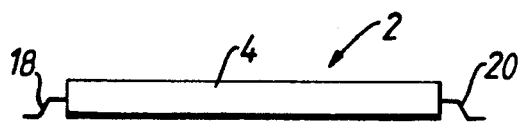
FIG. 2 is an elevational side view of the semiconductor chip package of FIG. 1.
Figure 3:
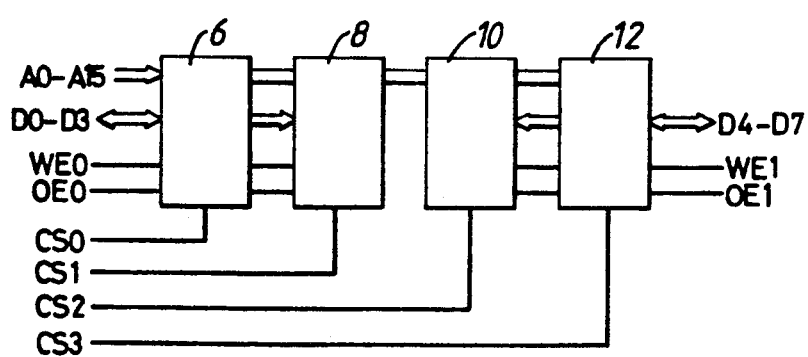
FIG. 3 is a schematic diagram of the electrical circuitry of the semiconductor chip package of FIG. 1.

Referring to FIGS. 1 to 3 of the drawings, there is shown a semiconductor chip package 2 in accordance with a first embodiment of the present invention. The semiconductor chip package 2 comprises an outer casing 4 within which are encapsulated one or more semiconductor chips (not shown). In this embodiment, four RAM chips are encapsulated in the outer casing 4 and these chips are represented by the four blocks 6, 8, 10, 12 shown in FIG. 3. On opposed edges 14, 16 of the outer casing 4 are disposed respective rows of pins 18, 20. The pins 18, 20, being disposed on opposed edges of the packages, are arranged in a conventional dual inline format but, as is shown in FIG. 2, they are formed as gull-wing leads. The package 2 has a memory capacity of $4 \times 64K \times 4$ or $2 \times 64K \times 8$.

In this illustrated embodiment, the package has forty pins, with twenty pins being disposed along each of edges 14 and 16 of the package 2 respectively. The pins are numbered 1 to 40 on FIG. 1. The pins comprise sixteen address inputs (A0 to A15), eight data signal pins (D0 to D7), two power supply pins (VCC), two earth pins (GND), four chip select pins (CS0 to CS3), two write enable pins (WE0 and WE1) and two output enable pins (OE0 and OE1). Each of these pins is connected to one or more chips as schematically represented in FIG. 3 (the VCC and GND pins being omitted in FIG. 3 for clarity). Thus these pins constitute a first type of pin 22 which is electrically connected to the at least one semiconductor chip 6,8,10,12 in the package 2 and is adapted to conduct electrical signals between the at least one semiconductor chip 6,8,10,12 and external circuitry which is not shown. The first type of pins are divided into a plurality of groups, each group representing a respective signal type, i.e. address input pins (A), data signal pins (D), power supply pins (VCC, GND) and various control pins (CS, WE, OE). The package is also provided with four redundant pins 24 which are constituted by pins numbered 24 to 27 in FIG. 1. The redundant pins 24 constitute a second type of pin 24 which is not electrically connected to the at least one semiconductor chip 6,8,10,12 in the package 2.

The distribution of the first type 22 and second type 24 of pins on package 2 will now be described. All of the first type of pins 22 other than one group of first type of pins 22, namely the CS pins, are symmetrically disposed on respective sides 14,16 of the package 2. Thus opposite each address A, power VCC or GND, data D, write enable WE or output enable OE pin is another similar pin of the same group. The chip select CS pins and the redundant NC pins are asymmetrically disposed on respective sides 14,16 of the package 2 such that opposite each of the four chip select CS pins there is a redundant NC pin. For those pins of the groups of the first type of pins 22 other than the chip select CS pins, the symmetry is reflectional symmetry about a plane extending longitudinally through the center of the package 2 parallel to the two sides 14 and 16. Thus the pinout is symmetrical with respect to all signals except the chip select signals and has redundant NC pins where symmetry of the chip select CS pins would require additional chip select CS pins.

Figure 4:
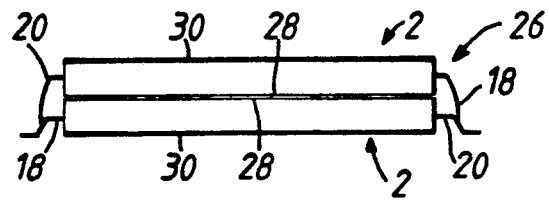
FIG. 4 is an elevational side view of a module comprising two semiconductor chip packages of FIG. 1 in stacked configuration.
Figure 5:
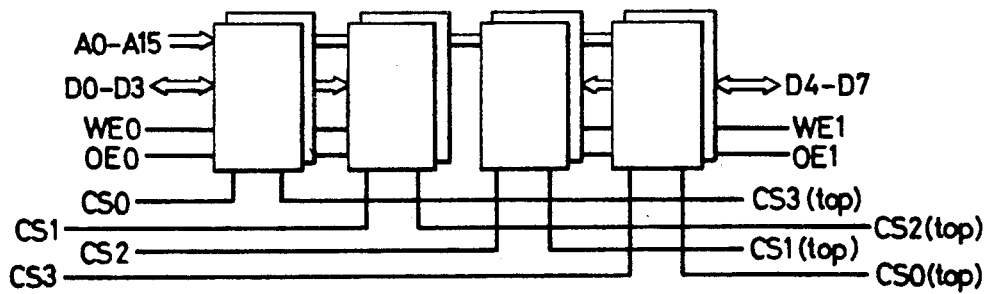
FIG. 5 is a schematic diagram of the electrical circuitry of the module of FIG. 4.

FIG. 4 shows a module 26 comprising a stacked configuration of two of the semiconductor chip packages 2 of FIG. 1. The semiconductor chip packages 2 are double stacked by turning one of the pair of identical semiconductor chip packages 2 upside down with respect to the other whereby the upper surfaces 28 of the two semiconductor chip packages 2 are adjacent to each other and the bottom surfaces 30 are remote from each other. The pins 18,20 on opposing sides of each package 2 are connected in the manner shown in FIG. 4 to the directly adjacent pins 20,18 of the other package 2. Thus, pin number 1 (VCC) of one package 2 is connected to pin number 40 (also VCC) of the other package 2, and vice versa. Pin number 2 (A) of one package 2 is connected to pin number 39 (also A) of the other package 2, both of which pins are address inputs. Since the semiconductor devices are RAMs rather than Read Only Memories (ROMs), the way in which the address inputs are connected between different packages is not important. Similar connections are made between the data D pins, the write enable WE pins, the output enable OE pins and the ground GND pins. However, each chip select CS pin (i.e. pins numbered 14 to 17) of a respective package 2 will be connected to a respective redundant NC pin (pins numbered 27 to 24 respectively) of the other package 2 and so the stacked module 26 will have twice as many CS pins as each individual package. The circuit diagram of the resultant stacked module 26 is shown in FIG. 5. It will be seen that there are sixteen address inputs in total since the thirty two address input pins of the two packages 2 have been connected together in pairs thereby to result in only sixteen address inputs A0 to A15 in the resultant module 26. The identification of the sixteen address inputs A0 to A15 in FIG. 5 corresponds to that of the bottom package 2. The module also has, for a similar reason, only eight data inputs D0 to D7 and the identification of these data inputs in FIG. 5 corresponds to that of the bottom packages. The module 26 similarly has two write enable inputs WE0 and WE1 and the identification of these inputs corresponds to that of the bottom package 2. Furthermore, in a similar fashion the module 26 has two output enable inputs OE0 and OE1 and the identification of these inputs corresponds to that of the bottom package 2. The module 26 has eight chip select CS inputs, the total number of chip select CS inputs corresponding to the total number in the individual separate packages 2 since the chip select CS inputs are connected to redundant NC inputs and are not connected together to each other in pairs. Four chip select inputs CS0 to CS3 are inputs for the four chips in the bottom package 2 and four chip select inputs CS0 (top) to CS3 (top) are chip select inputs for the four chips in the top package 2.

The module 26 has a memory capacity of $8 \times 64K \times 4$ or $4 \times 64K \times 8$.

In the illustrated embodiment, the asymmetry is present on the chip select CS pins. An advantage of putting the asymmetry on the chip select pins, rather than on the data pins, is that power in the package can be reduced and fewer pins would generally be used. However, in an alternative embodiment it is possible to have, for example, chip select signals on pins numbered 14, 15, 27 and 26 and to have just four data signals on pins numbered 8, 9, 10 and 11; pins 33, numbered 32, 31 and 30 would be redundant (NC) and pins numbered 16, 17, 24 and 25 would also be unused. Optionally, pins numbered 22 and 23 would become redundant as well. A single package of this type has a memory capacity of $4 \times 64K \times 4$ and a double-stacked module has a memory capacity of $4 \times 64K \times 8$.

It should be understood that in the device illustrated in FIGS. 1 to 5 the symmetry of the pinout is reflectional symmetry about a line parallel to pins numbered 1 to 20 with reflectional asymmetry being present on the chip select and the redundant pins. However, in alternative arrangements rotational symmetry may be provided either with or without reflectional symmetry.

For example, for a package with pins on two edges, there could be rotational symmetry through an angle of 180° and this could enable a module of four stacked packages to be provided. Such a configuration constitutes a second embodiment of the present invention which is illustrated in FIGS. 6 and 7.

Figure 6:
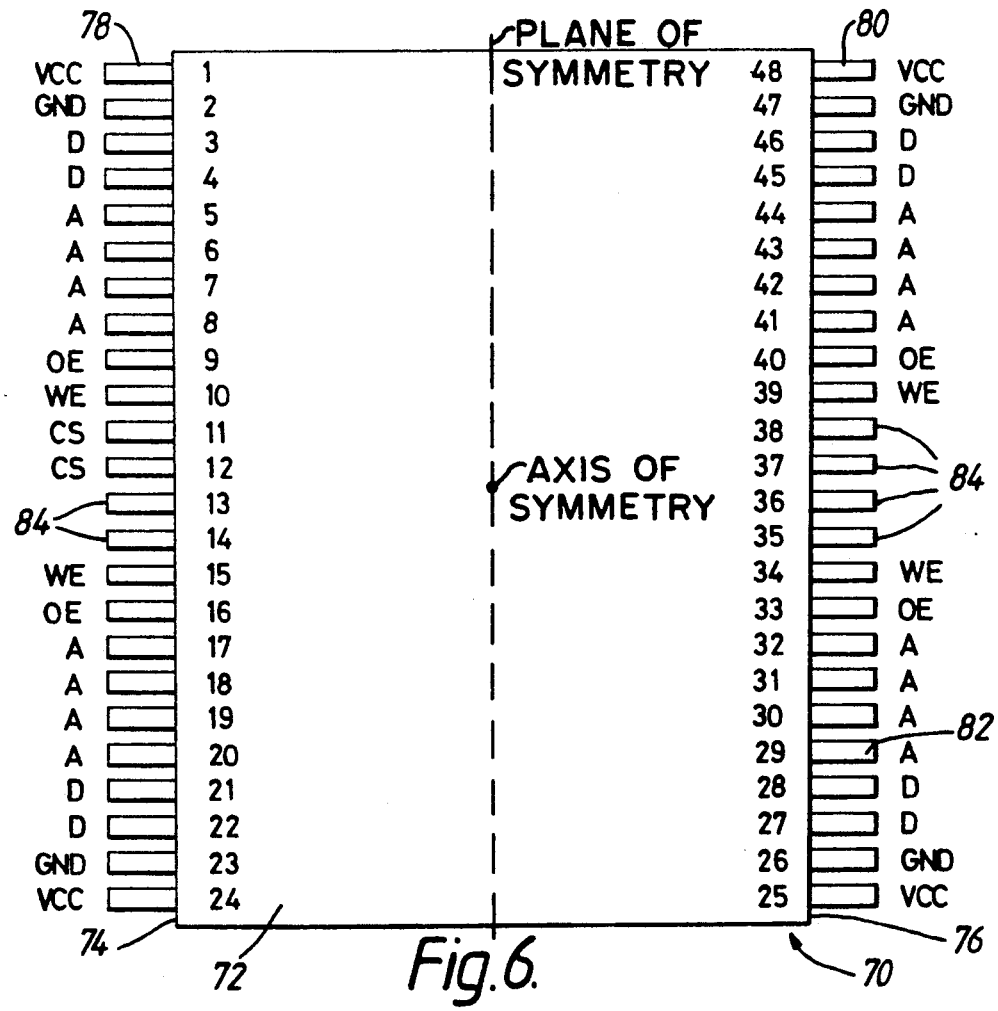
FIG. 6 is a schematic plan view of the pinout arrangement of a semiconductor chip package in accordance with a second embodiment of the present invention.
Figure 7:
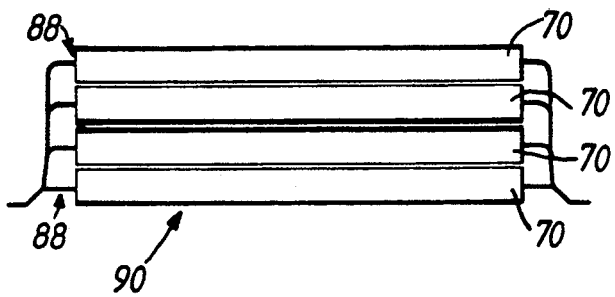
FIG. 7 is an elevational side view of a module comprising four semiconductor chip packages of FIG. 6 in stacked configuration.

FIG. 6 is a schematic plan of a semiconductor chip package 70 having an outer casing 72 within which are encapsulated one or more semiconductor chips (not shown). In this embodiment, two or four RAM chips are encapsulated in the outer casing 72, having a memory capacity of $2 \times 64 \times 8$. On opposed edges 74, 76 of the outer casing 72 are disposed respective rows of pins 78, 80, the arrangement being similar to that of the first embodiment shown in FIGS. 1 and 2. In this embodiment, the package 72 has forty eight pins, with twenty four pins being disposed along each of edges 74 and 76 of the package 72 respectively. The pins are numbered 1 to 48. The pins 82 which are electrically connected to the one or more semiconductor chips comprise sixteen address inputs (A), eight data signal pins (D), four power supply pins (VCC), four earth pins (GND), two chip select pins (CS), four write enable pins (WE), and four output enable pins (OE). Each of these pins 82 is connected to one or more chips in the package 70. The pins also comprise six redundant pins 84 which are constituted by pins numbered 13, 14, 35, 36, 37 and 38 in FIG. 6. The redundant pins 84 are not electrically connected to the at least one semiconductor chip in the package 70.

The distribution of the pins on the package 70 is such that for all the connected pins i.e. the VCC, GND, D, A, OE and WE pins, other than the chip select CS pins, there is both a reflectional symmetry about a longitudinal central plane extending through the package and rotational symmetry about 180° about an axis extending perpendicularly from the plane of the package 70. The two chip select pins numbered 11 and 12 are opposite redundant pins numbered 37 and 38 on the opposite side of the package and both the chip select pins numbered 11 and 12 and those redundant pins numbered 37 and 38 are each adjacent a respective further pair of redundant pins on the same side of the package numbered 13 and 14 and 35 and 36 respectively.

It will be seen that if a package 70 is disposed over a second package 70 in an upside down configuration, each of the electrically connected pins 82 other than the chip select CS pins will overlie a similar pin 82 of the other package 70. The two chip select pins of one package 70 will be connected to respective redundant pins 84 of the other package 70 and vice versa. Thus a module 88 of two of the packages 70 can be constructed similar to the module 88 shown in FIG. 4 wherein the module 88 is provided withn four separate chip select pins, with a pair of chip select pins being disposed on each side of the module 88. The two package module 88 also has four redundant pins corresponding to pins 13, 14, 35 and 36 of each package 70.

Referring to FIG. 7, a composite module 90 can be constructed out of two of the modules 88, each of which modules 88 comprises a pair of the packages 70. The top module 88 is rotated by an angle of 180° relative to the bottom module 88 whereby the four chip select CS pins of the upper module 88 are located over the four redundant pins 13, 14, 35 and 36 of the lower module 88. Thus the resultant four-layer stacked module 90 has eight resultant chip select pins, constituted by positions 11, 12, 13 and 14 on one side of the module 90 and by pins 35, 36, 37 and 38 on the other side of the module 90. Since there is four-fold symmetry in each package, all of the electrically connected pins 82 of each module 88 other than the chip select CS pin are connected to similar corresponding pins 82 of the other module 88 whereby the resultant four-layer stacked module 90 has a distribution of those pins which corresponds to the distribution shown in FIG. 6 of one package 70.

Figure 8:
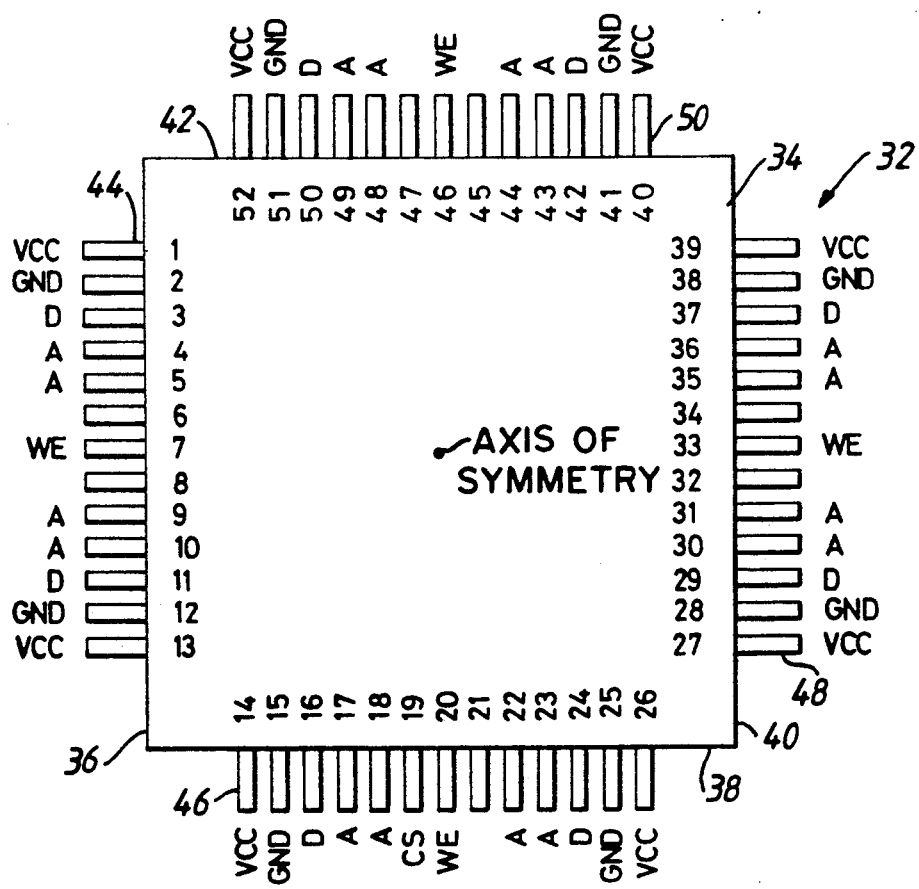
FIG. 8 is a schematic plan view of the pinout arrangement of a semiconductor chip package in accordance with a third embodiment of the present invention.
Figure 9:
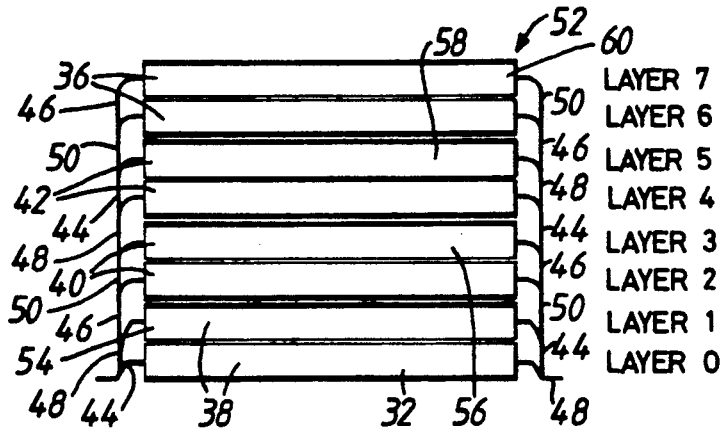
FIG. 9 is an elevational side view of a module comprising eight semiconductor chip packages of FIG. 8 in stacked configuration.
Figure 10:
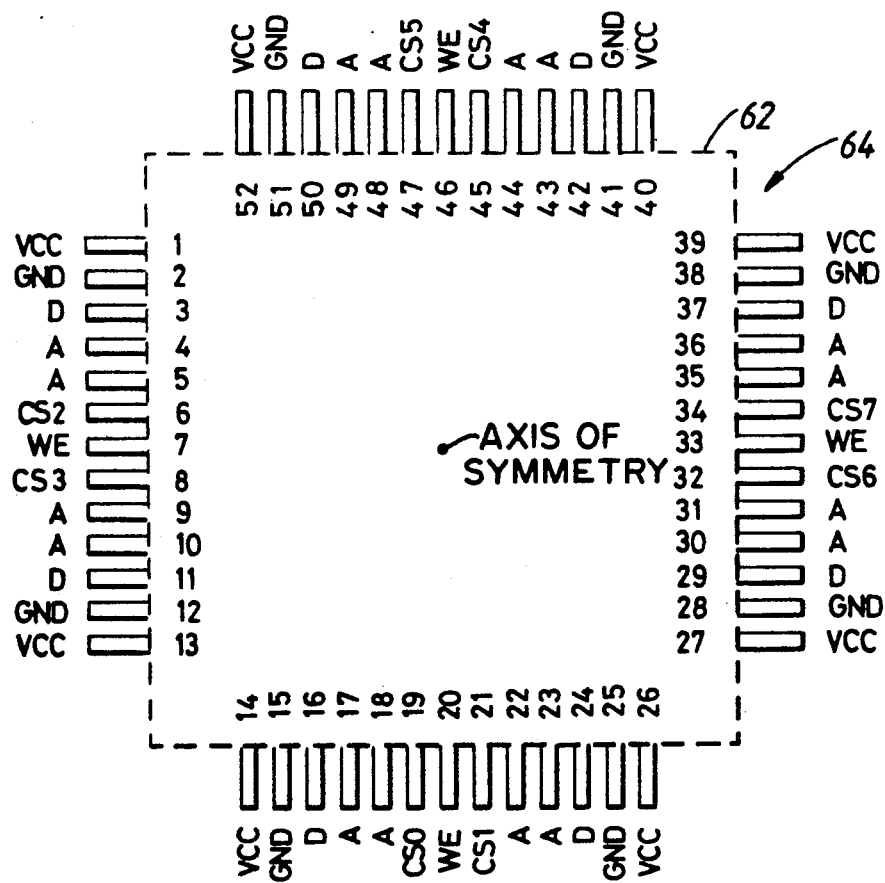
FIG. 10 is a schematic plan view of the bonding pad footprint on a printed circuit board for connecting the module shown in FIG. 9.

In a further alternative embodiment a package with pins on four orthogonal edges can provide rotational symmetry through an angle of 90°, allowing an eight package high stack and such a configuration constitutes a third embodiment of the present invention which is illustrated in FIGS. 8 to 10.

FIG. 8 is a schematic plan of a semiconductor chip package 32 having an outer casing 34 which has four orthogonal edges 36, 38, 40, 42. In the illustrated embodiment the outer casing 34 of the package 32 encapsulates a single semiconductor RAM chip (not shown) and each package has a memory capacity of 64K×8. The package 32 is provided with four rows 44, 46, 48, 50 of pins, each row 44, 46, 48, 50 being located along a respective edge 36, 38, 40, 42 of the outer casing 34. In each package 32 the chip has a capacity of 64K×8. Each package 32 has sixteen address pins A; eight data pins D; four write enable pins WE; eight power input pins VCC and eight earth pins GND. These groups of pins are both reflectively and rotationally symmetrically disposed on the four edges 36, 38, 40 and 42 of the package 32 whereby on opposing edges of the package 32 each of those pins is opposite a similar pin and for adjacent edges of the package 32 there is rotational symmetry about an angle of 90°. For simplicity, the pinout arrangement employs only a single chip select CS pin per package. The chip select CS pin is located on one edge 38 of the package 32, and in FIG. 8 is present as pin number 19. Seven redundant NC pins are additionally provided in positions numbered 6, 8, 21, 32, 34, 45 and 47. Two redundant pins are provided on each of the three edges 36, 40, 42 which are not provided with the chip select CS pin and the seventh redundant pin is provided on the same edge 38 as the chip CS select pin. The chip select CS pin is opposite to the redundant pin numbered 47 and in addition the redundant pin numbered 21 which is on the same edge 38 as the chip CS select pin numbered 19 is reflectively symmetrically disposed relative thereto about a plane passing through the central pin numered 20 on edge 38 of the package 32. On each edge 36, 40, 42 the redundant pins are located in positions corresponding to the positions of the chip select CS pin and the redundant pin on edge 38. For simplicity, the pinout does not include an output enable pin.

A module 52 of eight stacked packages 32 is shown in FIG. 9. The module consists of four stacked pairs 54, 56, 58, 60 of packages 32 thus providing an eight layer stack. The bottom pair 54 of packages 32 has a top package 32 which is disposed in an upside down configuration on a bottom package 32 with the overlying rows of pins 44, 46, 48, 50 being connected together. The pins are connected together in the manner similar to that of the first embodiment in that pin number 1 is connected to pin number 39, pin number 2 is connected to pin number 38, etc. for rows 44 and 48, and pin number 14 is connected to pin number 52, pin number 15 is connected to pin number 51, etc. for rows 46 and 50. In the bottom pair 54 of packages the two packages 32 are not rotated relative to each other whereby a common edge 38 is shown in FIG. 9. The chip select pin number 19 is connected to a redundant pin number 47 and the remaining redundant pins are connected to each other. A second pair 56 of packages 38 is disposed over the first pair 54. The second pair of packages 56 is connected together in the same way as the first pair 54 but the second pair 56 is rotated about an angle of 90° relative to the first pair 54 whereby the two edges 40 of the packages 32 of the second pair 56 is located above the two edges 38 of the first pair 54 as shown in FIG. 9. The pins of the second pair 56 are connected to each other and also to those of the first pair whereby it will be seen that the chip select CS pins of each package 32 of the second pair 36 are each connected to a respective redundant pin which is itself not connected to any other chip select CS pin. A third pair 58 of packages 32 is similarly mounted on the second pair 56, the third pair 58 being rotated about an angle of 90° relative to the second pair whereby the edges 42 of the two packages 32 of the third pair 58 are located above the edges 40 of the second pair 56. A fourth pair 60 of packages 32 is disposed in a similar manner above the third pair 58 with the edges 36 of the fourth pair being located above the edges 42 of the third pair 58. Thus the four stacked pairs 54,56,58,60 of packages 32 form an eight layer module 52 wherein each of the eight layers has a respective chip select CS position which is different from the chip select CS position of any other layer, with the chip select position of any given layer corresponding to a redundant pin position of all the other layers.

FIG. 10 shows the pinout connecting pad arrangement 62 on a printed circuit board 64 for the module 52 shown in FIG. 9. It will be seen that there are eight chip select pads CS0 to CS7 each of which accesses a respective chip in a respective package 32. In the drawing, CSn corresponds to the chip select CS pin of layer n of the module 52. Thus each edge of the bonding pad arrangement has two chip select CS pads, four address A pads, two data D pads, two earth GND pads, two power VCC pads and one write enable WE pad. The module offers a memory facility of 8×64K×8.

The present invention can provide a real advantage over the prior art in providing pinout arrangements which enable identical semiconductor chip packages to be stacked thereby to enable a semiconductor assembly to take up a reduced surface area. Although specific arrangements of reflectional and rotational symmetry have been described, it will be understood that various arrangments of rotational and reflectional symmetry can be employed in accordance with the present invention.

What we claim is:

1. A semiconductor chip package comprising: at least one semiconductor chip disposed in a package; and
 a plurality of first and second pins extending from the package, which first pins are electrically connected to the at least one semiconductor chip to conduct signals between the at least one semiconductor chip and external circuitry,
 the first pins being divided into a plurality of groups, each group being arranged to conduct a respective signal type, one of said groups comprising first group pins, and which second pins are redundant and are not electrically connected to the at least one semiconductor chip,
 at least one of the first group pins and the redundant pins forming at least one pair of first group and redundant pins, and the pins of each pair being functionally asymmetrically disposed in opposed relation along respective opposite or adjacent edges of the package and each remaining group of first pins being mutually symmetrically disposed along opposite or adjacent edges of the package.

2. A semiconductor chip package according to claim 1 wherein the first and second pins are located on a pair of opposed edges of the package.

3. A semiconductor chip package according to claim 2 wherein the symmetrical disposition of the said remaining groups of first pins is reflective symmetry.

4. A semiconductor chip package according to claim 2 wherein each first pin of the said remaining groups is opposite to a respective first pin of the same group and each first pin of the said at least one group is opposite a respective second pin.

5. A semiconductor chip package according to claim 3 wherein each first pin of the said remaining groups is opposite to a respective first pin of the same group and each first pin of the said at least one group is opposite a respective second pin.

6. A semiconductor chip package according to claim 1 wherein the first pins of the said at least one group comprise chip select pins.

7. A semiconductor chip package according to claim 1 wherein the first pins of the said at least one group comprise data pins.

8. A semiconductor chip package according to claim 1 wherein the first and second pins are located on each of four edges of the package.

9. A semiconductor chip package according to claim 8 wherein the symmetrical disposition of the said remaining groups of first pins on opposed edges of the package is reflective symmetry.

10. A semiconductor chip package according to claim 8 wherein the symmetrical disposition of the said remaining groups of first pins on adjacent edges of the package is rotational symmetry.

11. A semiconductor chip package according to claim 8 wherein the said first pins of the at least one group and the second pins are asymmetrically disposed on the opposed edges of the package.

12. A semiconductor chip package according to claim 8 wherein each first pin of the said remaining group is opposite a respective second pin, and each second pin which is not opposite a respective first pin of the said at least one group is opposite a respective second pin.

13. A semiconductor chip package according to claim 8 wherein the first pins of the said at least one group comprise chip select pins.

14. A semiconductor chip package according to claim 8 wherein the first pins of the said at least one group comprises data pins.

15. A module of semiconductor chip packages, the module comprising two semiconductor chip packages according to claim 1 which are stacked together to form a stacked pair of packages with each first pin of the said remaining groups of one package being connected to a corresponding first pin of the other package and each first pin of the said at least one group of the said one package being connected to a respective second pin of the said other package.

16. A module according to claim 15 wherein the said other package is mounted upside-down on the said one package and the said first and second pins of the two packages are connected along common edges of the module.

17. A module according to claim 16 wherein in each package the first and second pins are located on each of four edges of the package, and further comprising an additional stacked pair of packages which is stacked above the first-mentioned stacked pair, the additional stacked pair being rotated relative to the first stacked pair with each first pin/first pin connection of the first stacked pair being connected to a first pin/first pin connection of the additional stacked pair and each first pin/second pin connection of the first stacked pair being connected to a second pin/second p in connection of the additional stacked pair.

18. A module according to claim 17 further comprising two further stacked pairs of packages which are stacked above the said additional stacked pair, the two further stacked pairs being rotated relative to each other and relative to each of the first-mentioned and additional stacked pairs.

19. A package for one or more integrated circuits contained therein, the package being adapted for stacking with identical ones of such packages, comprising:
an integrated circuit located within the package;
the package having first, second, third and fourth sides;
an imaginary first axis of symmetry located between the first and third sides;
first, second and third groups of pins located symmetrically on said package;
said first group of pins being electrically coupled to said integrated circuit in the package, said first group of pins being located on said first and third sides of the package;
said second group of pins (24) not being electrically coupled to the integrated circuit in the package, said second group of pins being located on said first side of the package;
said third group of pins being electrically coupled to the integrated circuit in the package, said third group of pins being located on said third side of the package and disposed at a location that is reflectively symmetric to said second pins, with respect to said imaginary axis, so that said third pins are located opposite to said second pins;
said first group of pins being organized into and comprising N sets of pins, where N is an integer greater than 1, each respective set of said first pins having two or more pins;
said integrated circuit being coupled to receive at least two types of signals;
each said set in said first group of pins being identified with and coupled to conduct a corresponding one of said types of signals to be received by said integrated circuit;
within said first group of pins, any two or more power supply pins forming a first set, any two or more data pins forming a second set, any two or more address pins forming a third set; and any two or more ground pins forming a fourth set;
each set of said first group of pins comprising pins that are located on both said first and third sides of said package at locations that are reflectively symmetric about said imaginary axis, whereby the pins of the first set are located on the first and third sides of the package at locations that are reflectively symmetric to each other with respect to the imaginary axis, and the pins of the second set are located on the first and third sides of the package at locations that are reflectively symmetric to each other with respect to the imaginary axis;
the first group of pins being positioned so that when a said integrated circuit package is stacked with another like integrated circuit package, the first group of pins of one said package are aligned over said first group of pins of the other package;
the third group of pins being positioned so that when said integrated circuit package is so stacked, at least one pin of the third group of pins of one package is aligned with at least one pin of the second group of pins of the other package; whereby the relative configuration of the first, second and third groups of pins allows identical integrated circuit packages to be stacked and functionally interconnected.

20. A package according to claim 19 wherein said package is stackable with another identical package to form a stacked module and wherein in said stacked module said remaining groups of said first pins are aligned over said remaining groups of said first pins of said other identical package, and said chip select signal group of said package is aligned with said second pins of said other identical package.

21. A package according to claim 1 wherein said semiconductor chip is a semiconductor memory chip.

22. A package according to claim 21 wherein the first pins of the said at least one group comprise chip select pins and the first pins of the remaining groups comprise voltage, ground, address, data, write enable and output enable pins.

23. A semiconductor chip package comprising:
at least one semiconductor chip disposed in a package;
pairs of matching pins of a first type, each pin of a pair having a similar function and being connected to circuitry in the package;
at least one pin of a second type connected to circuitry in the package to select at least part of the package so as to render operative at least some of the pins of the first type of the package; and
at least one pin of a third type which is a redundant pin and not connected to circuitry in the package;
the distribution of the pins of the first and third types being such that first and second packages may be located adjacent each other with each pin of said first type on the first package lying adjacent a matching pin of the first type on the second package and with the said at least one pin of the second type on the first package lying adjacent said at least one pin of the third type on the second package.

24. A semiconductor chip package according to claim 23 wherein pins of said first, second and third types are located on a pair of opposed edges of the package.

25. A semiconductor chip package according to claim 23 wherein each pair of matching pins of said first type is disposed in opposed relation on the pair of opposed edges of the package and each pin of the second type is opposite a respective pin of the third type.

26. A semiconductor chip package according to claim 23 wherein the pins of the first, second and third types are located on each of four edges of the package.

27. A semiconductor chip package according to claim 26 wherein each pair of matching pins of said first type is disposed in opposed relation on an opposed pair of the four edges of the package.

28. A semiconductor chip package according to claim 26 wherein each pin of said second type is opposite a respective pin of the third type, and each pin of the third type which is not opposite a respective pin of the second type is opposite a respective pin of the third type.

29. A semiconductor chip package according to claim 23 wherein the pins of the second type comprise chip select pins.

30. A semiconductor chip package according to claim 23 wherein the pins of the second type comprise data pins.

31. A semiconductor chip package according to claim 23 wherein the pins of the first type comprise voltage, ground, address, data, write enable and output enable pins.

32. A semiconductor chip package according to claim 23, wherein the semiconductor chip is a semiconductor memory chip.

33. A module of semiconductor chip packages, the module comprising two semiconductor chip packages according to claim 23 which are stacked together to form a stacked pair of packages with each pin of the first type of one package being connected to a matching pin of the first type of the other package and each pin of the second type of the said one package being connected to a respective pin of the third type of the said other package.

34. A module according to claim 33 wherein the said other package is mounted upside-down on the said one package and the pins of said first, second and third types of the two packages are connected along common edges of the module.

35. A module according to claim 34 wherein in each package the pins of said first, second and third types are located on each of four edges of the package, and further comprising an additional stacked pair of packages which is stacked above the first-mentioned stacked pair, the additional stacked pair being rotated relative to the first stacked pair with each first pin type/first pin type connection of the first stacked pair being connected to a first pin type connection of the additional stacked pair and each second pin type/third pin type connection of the first stacked pair being connected to a third pin type/third pin type connection of the additional stacked pair.

36. A module according to claim 34 further comprising two further stacked pairs of packages which are stacked above the said additional stacked pair, the two further stacked pairs being rotated relative to each other and relative to each of the first-mentioned and additional stacked pairs.

37. A semiconductor chip package comprising:
at least one semiconductor chip disposed in a package;
pairs of matching pins of a first type, each pin of a pair having a similar function and being connected to circuitry in the package;
at least one pin of a second type connected to circuitry in the package to select at least part of the package so as to render operative at least some of the pins of the first type of the package; and
at least one pin of a third type which is a redundant pin and not connected to circuitry in the package;
the distribution of the pins of the first and third types being such that first and second packages may be located adjacent each other with each pin of said first type on the first package lying adjacent a matching pin of the first type on the second package and with the said at least one pin of the second type on the first package lying adjacent said at least one pin of the third type on the second package, and
wherein said package has an axis of symmetry for the location of pins of said first type, two pins of a matching pair of pins of a first type being located symmetrically relative to each other with respect to said axis, whereby each may be located against a matching pin on an adjacent package, and said at least one pin of a second type is located symmetrically with respect to said axis with said at least one pin of a third type.

38. A semiconductor chip package according to claim 37 wherein pins of said first, second and third types are located on a pair of opposed edges of the package.

39. A semiconductor chip package according to claim 37 wherein each pair of matching pins of said first type is disposed in opposed relation on the pair of opposed edges of the package and each pin of the second type is opposite a respective pin of the third type.

40. A semiconductor chip package according to claim 37 wherein the pins of the first, second and third types are located on each of four edges of the package.

41. A semiconductor chip package according to claim 40 wherein each pair of matching pins of said first type is disposed in opposed relation on an opposed pair of the four edges of the package.

42. A semiconductor chip package according to claim 40 wherein each pin of said second type is opposite a respective pin of the third type, and each pin of the third type which is not opposite a respective pin of the second type is opposite a respective pin of the third type.

43. A semiconductor chip package according to claim 37 wherein the pins of the second type comprise chip select pins.

44. A semiconductor chip package according to claim 37 wherein the pins of the second type comprise data pins.

45. A semiconductor chip package according to claim 37 wherein the pins of the first type comprise voltage, ground, address, data, write enable and output enable pins.

46. A semiconductor chip package according to claim 37, wherein the semiconductor chip is a semiconductor memory chip.

47. A module of semiconductor chip packages, the module comprising two semiconductor chip packages according to claim 37 which are stacked together to form a stacked pair of packages with each pin of the first type of one package being connected to a matching pin of the first type of the other package and each pin of the second type of the said one package being connected to a respective pin of the third type of the said other package.

48. A module according to claim 47 wherein the said other package is mounted upside-down on the said one package and the pins of said first, second and third types of the two packages are connected along common edges of the module.

49. A module according to claim 48 wherein in each package the pins of said first, second and third types are located on each of four edges of the package, and further comprising an additional stacked pair of packages which is stacked above the first-mentioned stacked pair, the additional stacked pair being rotated relative to the first stacked pair with each first pin type/first pin type connection of the first stacked pair being connected to a first pin type/first pin type connection of the additional stacked pair and each second pin type/third pin type connection of the first stacked pair being connected to a third pin type/third pin type connection of the additional stacked pair.

50. A module according to claim 48 further comprising two further stacked pairs of packages which are stacked above the said additional stacked pair, the two further stacked pairs being rotated relative to each other and relative to each of the first-mentioned and additional stacked pairs.

51. A package for one or more integrated circuits contained therein, the package being adapted for stacking with identical ones of such packages, comprising:
an integrated circuit located within the package;
the package having first, second, third and fourth sides;
an imaginary first axis of symmetry located between the first and third sides;
a plurality of pins located symmetrically on said package, including first pins connected to the integrated circuit within the package for receiving and supplying address signals, data signals, power supply signals, and a ground signal;
the pins for supplying the address signals being symmetrically located about said axis;
the pins for supplying the data signals being symmetrically located about said axis;
the pins for supplying the power supply signals being symmetrically located about said axis;
the pins for supplying the ground signals being symmetrically located about said axis;
said plurality of pins including a group of unconnected pins which are not electrically coupled to the integrated circuit in the package, said second group of pins being located on said first side of the package;
said plurality of pins including a set of chip enable pins electrically coupled to the integrated circuit in the package, said chip enable pins being located on said third side of the package and disposed at a location that is reflectively symmetric to said unconnected group of pins, with respect to said imaginary axis, so that said chip enable pins are located opposite to said unconnected pins;
the first pins being positioned so that when a said integrated circuit package is are stacked with another like integrated circuit package, the first pins of one said package are aligned over said first pins of the other package;
the chip enable pins being positioned so that when said chip packages are stacked, at least one of the chip enable pins of one package is aligned with at least one unconnected pin of the other package; whereby the relative configuration of the pins allows identical integrated circuit packages to be stacked and functionally interconnected.

* * * * *